United States Patent [19]

Chapelle

[11] Patent Number: 4,646,035
[45] Date of Patent: Feb. 24, 1987

[54] HIGH PRECISION TUNABLE OSCILLATOR AND RADAR EQUIPPED WITH SAME

[75] Inventor: Pierre Chapelle, Montrouge, France

[73] Assignee: Thomson-CSF, Paris, France

[21] Appl. No.: 690,257

[22] Filed: Jan. 10, 1985

[30] Foreign Application Priority Data

Jan. 13, 1984 [FR] France .................... 84 00501

[51] Int. Cl.⁴ ............................................. H02B 23/00
[52] Int. Cl. .................................... 331/177 R; 331/176
[58] Field of Search ................ 331/177 R, 179, 34, 331/176

[56] References Cited

U.S. PATENT DOCUMENTS 4,129,832 12/1978 Neal et al. .................... 331/178
4,243,949 1/1981 Saul et al. ..................... 331/176
4,297,657 10/1981 Frerking ....................... 331/176

FOREIGN PATENT DOCUMENTS 00088669 9/1983 Euopean Pat. Off. .
2064248 6/1981 United Kingdom .

Primary Examiner—Gene Wan
Attorney, Agent, or Firm—Oblon, Fisher, Spivak, McClelland & Maier

[57] ABSTRACT

A frequency tunable oscillator is associated to a memory (4) which stores the digital values required for controlling the oscillator with a view to obtaining the desired frequency. The digital values are converted by a digital-analog converter into a control voltage for controlling the oscillator (1). The device allows to compensate any non-linear behaviour of the components, as well as the variations of their behaviour with temperature. The present invention is applicable primarily to oscillators generating a frequency which is proportional to a voltage supplied to the oscillator.

7 Claims, 4 Drawing Figures

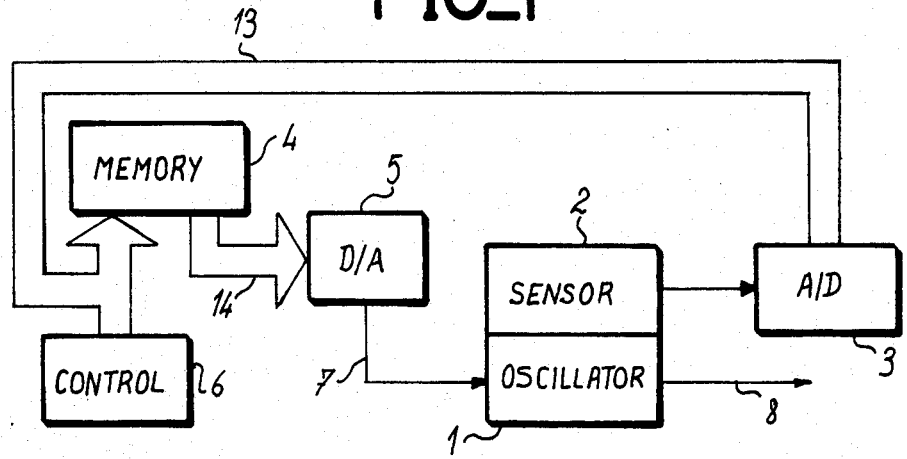
FIG_1
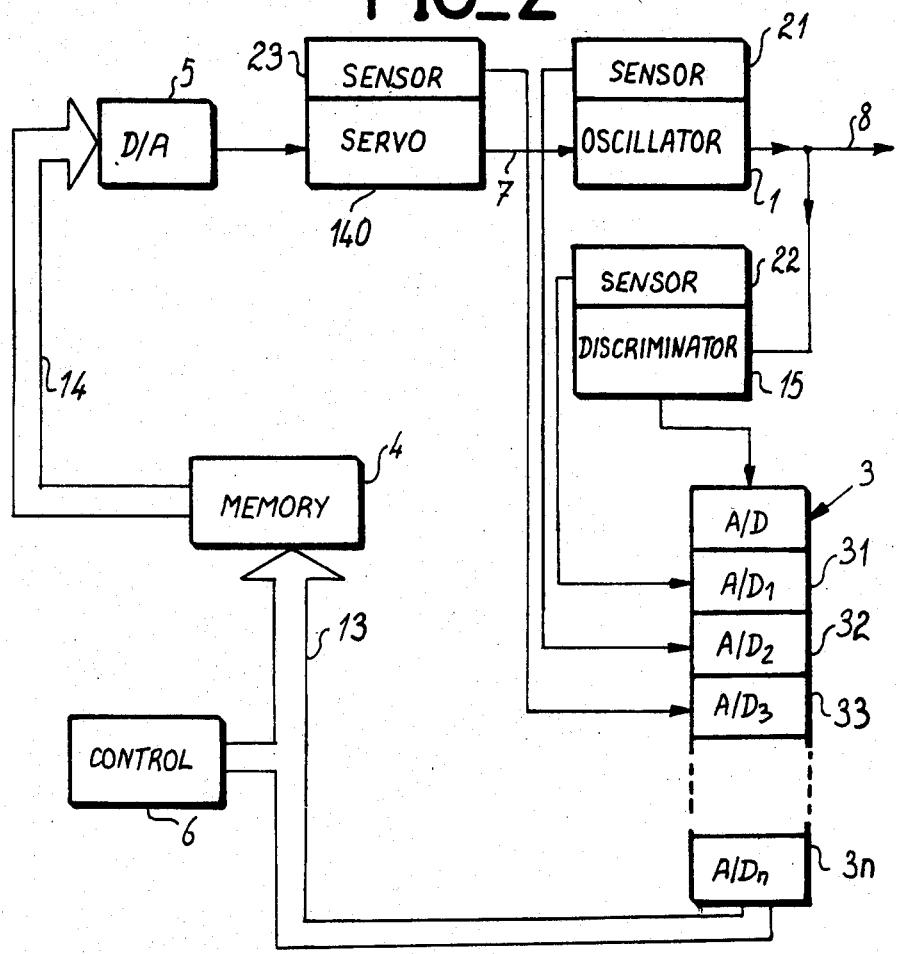
FIG_2

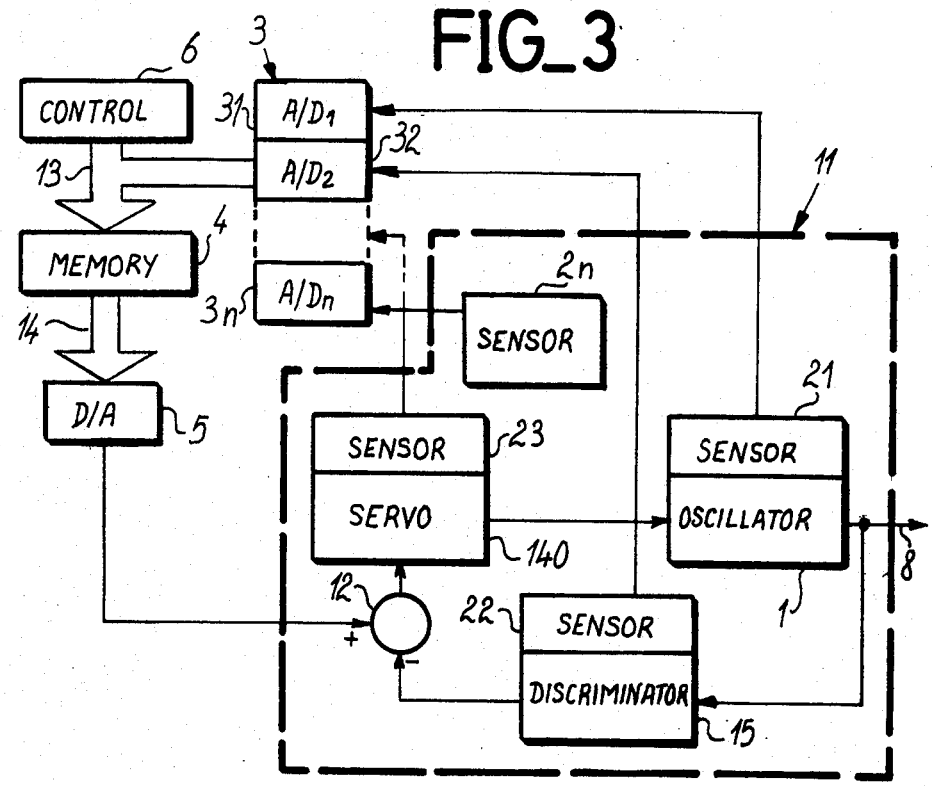
FIG_3
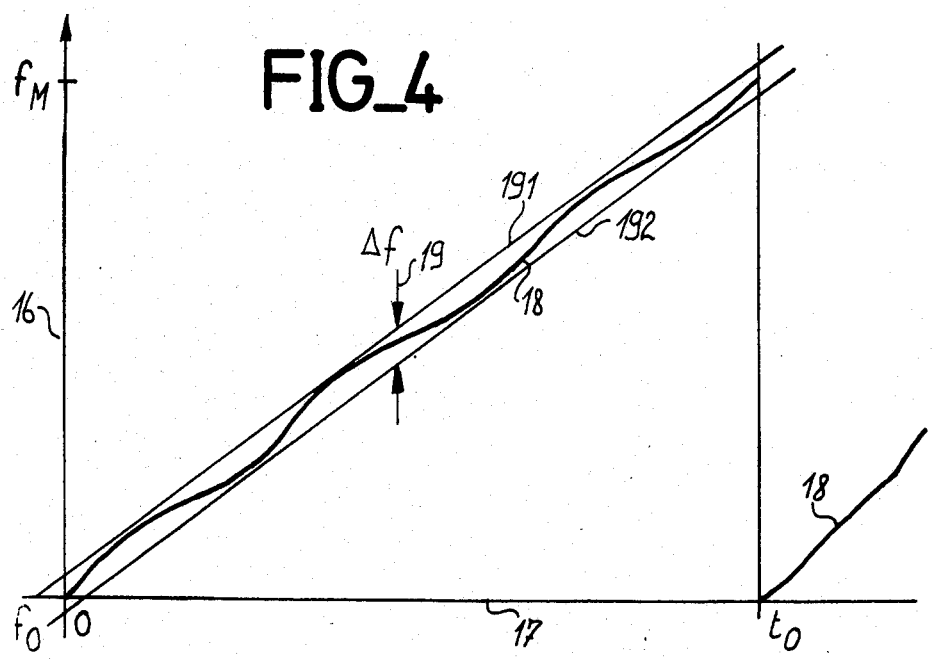
FIG_4

HIGH PRECISION TUNABLE OSCILLATOR AND RADAR EQUIPPED WITH SAME

BACKGROUND OF THE INVENTION

The present invention is primarily related to high-precision tunable oscillators.

In the present specification the oscillator circuit shown at reference numeral 1 in the appended FIGS. 1,2 and 3 as well as the device according to the invention, which generates an electric current having a desired frequency will both be designated by the term "oscillator".

A great number of electric or electronic devices comprise tunable oscillators. As regards certain devices of this kind, such as frequency-modulated continuous wave radars (FM-CW), the performance of the device depends directly on the precision of the frequency generated by the oscillator.

It is known to include in an oscillator a frequency servo loop. Any deviation will then modify the control means of the oscillator so as to provide the desired frequency. Such devices comprising a frequency servo loop allow oscillators to be produced which generate frequencies with a precision of several percent.

In accordance with the present invention the corrections to be made to the control of an oscillator or a frequency servo loop of an oscillator are stored in a memory with a view to improving the frequency precision. Such corrections are mainly required due to the utilization of components the behaviour of which is not of a perfectly linear, and due to the variations with temperature of the behaviour of the components used.

It is a primary object of the invention to provide an oscillator which comprises a memory connected to digital-analog converters and to an oscillator; the memory stores the digitalized voltage values required with a view to obtaining the different desired frequencies.

BRIEF DESCRIPTION OF THE DRAWINGS

The invention will be explained herein-below in more detail, particularly with reference to the appended figures which are given by way of illustration, but not of limitation, and wherein:

FIG. 1 shows a first embodiment of the device according to the invention.

FIG. 2 shows a second embodiment of the device according to the invention.

FIG. 3 illustrates a third embodiment of the novel device.

FIG. 4 represents the performances achieved by the device shown in FIG. 3.

DETAILED DESCRIPTION OF THE DRAWING

In the example described herein an oscillator supplies a frequency f as a function of the control voltage applied. It lies, however, within the scope of the present invention to apply the subject device to other types of oscillators.

FIG. 1 shows a device according to the invention which comprises no frequency servo loop. The device comprises an oscillator 1 to the input terminal 7 of which a voltage v is applied and which supplies at its output terminal 8 a frequency f equal to g (v,$\theta$) wherein $\theta$ is the temperature to which the oscillator 1 is brought, and g is a quasi linear monotonous function of v. The device according to the invention is designed to correct the non-linearities of g and/or its variation with temperature $\theta$. Advantageously oscillator 1 comprises a temperature sensor 2 connected to an analog-digital converter 3; the digitalized value of the temperature of oscillator 1, as well as a digital control value generated by a control device 6 are transmitted by an address bus 13 of a memory 4. Stored at this address in memory 4 is a value u corresponding to the voltage applied to oscillator 1, taking into account the parameters which are taken into consideration with a view to obtaining the desired frequency. The datum u read by memory 4 is transmitted to a digital-analog converter by a data bus 14. The digital-analog converter converts datum u read in memory 4 into a control voltage for oscillator 1. Memory 4 advantageously is of the programmable read-only (PROM) type. To each value of the couple (u,$\theta$) corresponds, in memory 4, a digital value of the voltage to be supplied at 7 to oscillator 1 in order to obtain the desired frequency.

FIG. 2 shows a device according to the invention as applied to an oscillator incorporated in a frequency servo loop. An electronic servo system 140 supplies at the input terminal 7 of the oscillator the transfer function allowing a frequency to be generated at the output terminal 8 of oscillator 1. The electronic servo system is constituted for instance, by an integrating circuit. A descrimination 15 converts frequency f into a voltage. Discriminator 15 is, for example, a circuit of the type having a retarding line. An input signal of the cos (ft) type is transmitted parallely, directly and through a retarding line and reaches a multiplier. The multiplier output signal is of the type cos (ft) cos (f(t−$\pi$)), wherein $\pi$ is the delay produced by the retarding line. The signal passes through a low pass filter and approximately equals cos (f$\pi$). Considering the linear range of discriminator 15, it becomes apparent that cos (f$\pi$)≅f$\pi$. Thus f$\pi$ is a voltage proportional to frequency f. An analog-digital converter 3 digitalizes the output voltage of discriminator 15. Temperature sensors 21, 22, 23 are located respectively on oscillator 1, discriminator 15 and electronic servo system 140. The voltages corresponding to the temperatures measured at these different locations are digitalized by analog-digital converters 31, 32, 33, respectively. Other embodiments of the invention may comprise a different number of temperature sensors and analog converters associated thereto. Analog-digital converters 3 and electronic control system 6 are connected through an address bus 13 to memory 4. Memory 4 is connected through a data bus 14 to a digital-analog converter 5. Digital-analog converter 5 is connected to electronic servo system 140.

Due to the provision of the memory it is possible to correct the deviations from linearity of electronic servo system 140, oscillator 1 and discriminator 15, as well as their behaviour variations with temperature. The digital value of the voltage to be applied to oscillator 7 for generating a desired frequency is stored in memory 4 at the address corresponding to the digitalized control, the digitalized value of the voltage corresponding to the output frequency at 8 of oscillator 1, and the digitalized values of the voltages corresponding to the temperatures prevailing at different locations of the device.

FIG. 3 shows a device according to the invention which is more particularly designed to be used in the field of oscillators capable of varying rapidly the generated frequency, and hyperfrequency oscillators. In this case it proves very difficult to include analog-digital and digital-analog converters in a frequency servo loop.

There is indeed a limitation, due to the response time or delay of such devices. Furthermore digital-analog converter 5 should introduce as small an amount of distortion as possible of the digitalization. By using lower frequency servo loop 11 it is possible to have a wider choice amongst the commercialized circuits, as regards the digital-analog converting circuits. Frequency servo loop 11 comprises an electronic servo system 140 connected to the input terminal of oscillator 1. Output terminal 8 of oscillator 1 is connected to a frequency discriminator 15. Frequency discriminator 15 is connected to an adder 12. Temperature sensors 21 to 2n are disposed on frequency servo loop 11. These temperature sensors are connected through address bus 13 to memory 4; memory 4 is connected through data bus 14 to a digital-analog converter 5; digital-analog converter 5 is connected to adder 12; adder 12 is connected to electronic servo system 140. Adder 12 subtracts from the applied voltage the voltage correction required for obtaining the desired frequency at output terminal 8 of oscillator 1. The digitalized value of the control voltage required for obtaining the desired frequency is stored in memory 4 at the address corresponding to the digitalized values of the temperatures prevailing at the different locations of frequency servo loop 11 and to the control voltage delivered at a control device 6. This control voltage value is converted by the digital-analog converter into a voltage to which are added the corrections made by frequency discriminator 15 in adder 12.

The device shown in FIG. 3 is particularly well adapted to be used with frequency modulated continuous wave radars. Such radars require the supply of an electric current the frequency of which increases for each period in a linear manner with time. The performance of such radar directly depends on the accurateness of the linear behaviour of frequency with time. In such devices the control means 6 are advantageously constituted by a counter associated to a clock. In a variant the control device 6 comprises a voltage generator the voltage of which varies in a linear manner with time, and an analog-digital converter.

FIG. 4 illustrates the variation of frequency with time, in the device shown in FIG. 3. The time t is represented by the abscissae 17, while the ordinates 16 represent the frequency f. The variation of frequency as a function of time is indicated by curve 18. This curve is comprised between two straight lines 191 and 192. The frequency difference $\Delta f$ between these straight lines 191 and 192 corresponds to the maximum deviations of the real frequency from the desired frequency in the device shown in FIG. 3. The frequency obtained at the output terminal 8 of the oscillator varies between the instants $t=0$ and $t_0$ in a substantially linear manner between a minimum frequency $f_0$ and a maximum frequency $f_M$. The precision of the device according to FIG. 3: $(\alpha f/f_M - f_0)$ is approximately equal to 2 to $3 \times 10^{-4}$.

The device according to the present invention allows entirely automatic manufacturing and requires no adjustments.

The analog components of the device according to the invention are reduced to a minimum, thus allowing to decrease the size of the device as well as its cost, which is particularly critical in the case of a hyperfrequency oscillator and discriminator.

In a first embodiment of the invention the values common to a group of oscillators and discriminators are stored in memory 4, whereby the prime cost can be decreased.

In a second embodiment of the invention, memory 4 -with a view to still further increasing the precision- stores the values required for the operation of an individualized oscillator and discriminator associated to said memory 4.

The invention applies mainly to frequency controlled oscillators.

The invention is not limited to the embodiments shown and described herein; many modifications and variants can be envisaged by those skilled in the art within the scope of the invention as defined in the appended claims.

What is claimed is:

1. A high frequency generator comprising:
   a controllable oscillator;
   temperature sensors thermally connected to said oscillator having an output;
   an analog to digital converter connected to said oscillator's output and driven threby and further connected to said temperature sensors for converting the output of said temperature sensor to a digital signal;
   a permanent non-volatile memory having the address bus and the data bus connected to said analog to digital converter for storing the digital signal produced by said analog to digital converter;
   a digital to analog converter coupled to said permanent non-volatile memory;
   connecting means for coupling said controllable oscillator to said digital to analog converter thereby providing the stored signal values in said non-volatile memory sufficient to control said oscillator at the desired frequency for each working temperature.

2. A high frequency generator as in claim 1 wherein said oscillator comprises:
   a frequency servo loop.

3. A high frequency generator according to claim 2 in which the frequency servo loop comprises a voltage controlled oscillator, data stored in said memory being adapted to linearize individually the response of voltage controlled oscillator associated thereto.

4. A high frequency generator according to claim 1 which employs means to operate as a hyperfrequency generator.

5. A high frequency generator according to claim 1 wherein said memory is a PROM.

6. A radar unit employing a high frequency oscillator wherein said oscillator comprises:
   a controllable oscillator;
   temperature sensors thermally connected to said oscillator having an output;
   an analog to digital converter connected to said oscillator's output and driven threby and further connected to said temperature sensors for converting the output of said temperature sensor to a digital signal;
   a permanent non-volatile memory having the address bus and the data bus connected to said analog to digital converter for storing the digital signal produced by said analog to digital converter;
   a digital to analog converter coupled to said permanent non-volatile memory;
   connecting means for coupling said controllable oscillator to said digital to analog converter thereby providing the stored signal values in said non-volatile memory sufficient to control said oscillator at the desired frequency for each working temperature.

7. A radar according to claim 6 which employs a frequency modulated continuous wave (FM—CW) radar.